United States Patent
Wee et al.

(10) Patent No.: US 7,029,933 B2
(45) Date of Patent: Apr. 18, 2006

(54) METHOD FOR MONITORING ION IMPLANT DOSES

(75) Inventors: Siew Fong Wee, Singapore (SG); Luey Chwan Liong, Malaysia (SG)

(73) Assignee: Tech Semiconductor Singapore Pte. Ltd., Singapore (SG)

( * ) Notice: Subject to any disclaimer, the term of this patent is extended or adjusted under 35 U.S.C. 154(b) by 0 days.

(21) Appl. No.: 10/874,474

(22) Filed: Jun. 22, 2004

(65) Prior Publication Data

US 2005/0282366 A1 Dec. 22, 2005

(51) Int. Cl.
*H01L 21/66* (2006.01)
*G01R 31/302* (2006.01)

(52) U.S. Cl. .......................................... 438/17; 324/752

(58) Field of Classification Search ............... 438/14, 438/16, 17, 18; 324/752, 753, 751, 758
See application file for complete search history.

(56) References Cited

U.S. PATENT DOCUMENTS

| | | | | |
|---|---|---|---|---|
| 4,598,249 | A * | 7/1986 | Goodman et al. | 324/752 |
| 4,755,049 | A | 7/1988 | Bomback et al. | 356/30 |
| 4,854,710 | A | 8/1989 | Opsal et al. | 356/432 |
| 5,074,669 | A | 12/1991 | Opsal | 356/445 |
| 5,661,408 | A | 8/1997 | Kamieniecki et al. | 324/765 |
| 6,011,404 | A | 1/2000 | Ma et al. | 324/765 |
| 6,249,117 | B1 * | 6/2001 | Koelsch et al. | 324/158.1 |
| 6,265,890 | B1 | 7/2001 | Chacon et al. | 324/765 |
| 6,268,916 | B1 | 7/2001 | Lee et al. | 356/369 |
| 6,326,220 | B1 * | 12/2001 | Chen et al. | 438/14 |
| 6,489,776 | B1 | 12/2002 | Stowe et al. | 324/458 |
| 2004/0191936 | A1 * | 9/2004 | Tsidikovski et al. | 438/18 |

OTHER PUBLICATIONS

"Non-contact, In-line Monitoring of Low Dose and Low Energy Ion Implantation," by Santiesteban et al., Lucent Tech., Orlando, Fl.

"Determination of surface space charge capacitance using a light probe," by E. Kamieniecki, pp. 811-814, J. Vac. Sci-Technol., 20 (3), Mar. 1982, 1982 American Vacuum Society.

* cited by examiner

*Primary Examiner*—Matthew Smith
*Assistant Examiner*—Lex H. Malsawma
(74) *Attorney, Agent, or Firm*—George D. Saile; Stephen B. Ackerman

(57) ABSTRACT

Both the sensitivity and the reproducibility of processes for measuring low density ion implant doses near a semiconductor surface have been improved by first forming a thermal oxide layer on the surface and then adjusting the implant profile so that it peaks at the semiconductor-oxide interface. Additionally, variations in the initial wafer surface condition have been minimized by controlling the charging dose and sequence prior to performing the measurements.

38 Claims, 4 Drawing Sheets

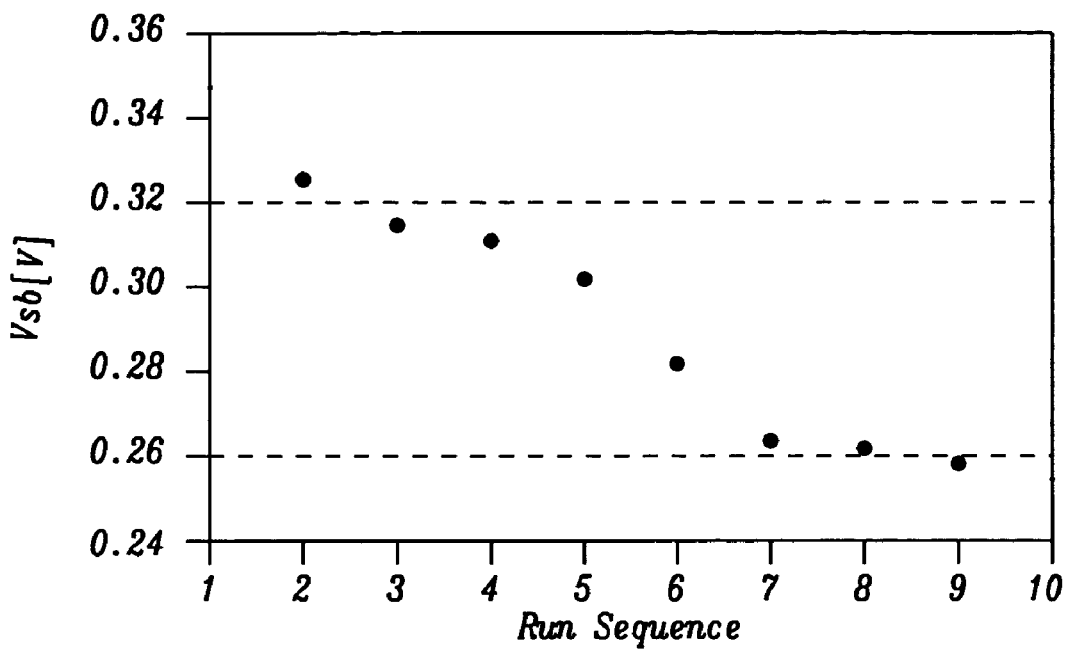
*FIG. 1 - Prior Art*
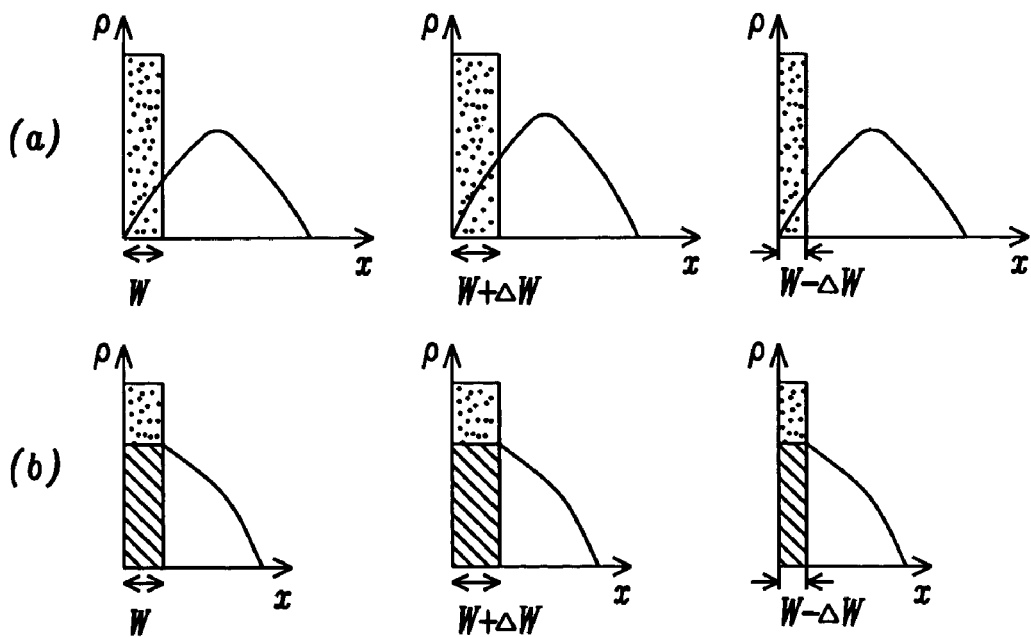
*FIG. 2*

METHOD FOR MONITORING ION IMPLANT DOSES

FIELD OF THE INVENTION

The invention relates to the general field of electrical characterization of dosage and energy of implant, particularly low dose and low energy and more specifically to ways to improve repeatability of measurement during monitoring.

BACKGROUND OF THE INVENTION

There are several known methods for monitoring ion implant doses, including sheet resistance based methods and thermal wave based methods. However, these two methods are not sensitive enough to be reliably used for monitoring low dose (1E11 cm$^{-2}$) and low energy (<10 keV) implant. Secondary Ion Mass Spectroscopy (SIMS), which is another method for implant monitoring, has the advantage of high sensitivity, but its low throughput limits its applicability for in-line process control. Techniques that employ the measurement of Surface Photovoltage (SPV) to determine doping concentration can be used for monitoring low dose implants but the results obtained when using such techniques are generally not reproducible for near surface doping measurement.

In view of the above, a method which is able to provide good reproducibility and sensitivity for monitoring low dose and low energy ion implants is to be desired.

A routine search of the prior art was performed with the following references of interest being found:

U.S. Pat. No. 4,854,710, Opsal et al. Method and apparatus for evaluating surface and sub-surface features in a semiconductor. U.S. Pat. No. 4,755,049, Bomback et al. Method and apparatus for measuring the ion implant dosage in a semiconductor crystal. U.S. Pat. No. 5,074,669, Opsal Method and apparatus for evaluating ion implant dosage levels in semiconductors. U.S. Pat. No. 5,661,408, Kamieniecki et al. Real time in-line testing of semiconductor wafers. U.S. Pat. No. 6,268,916, Lee at al. System for non-destructive measurement of samples. U.S. Pat. No. 6,265,890, Chacon et al. In-line non-contact depletion capacitance measurement method and apparatus. U.S. Pat. No. 6,326,220, Chen et al. Method for determining near surface doping concentration. U.S. Pat. No. 6,011,404, Ma et al. System and method for determining near surface lifetimes and the tunneling field of a dielectric in a semiconductor. U.S. Pat. No. 6,489,776, Stowe et al. Non-contact mechanical resonance method for determining the near surface carrier mobility in conductors.

It should be noted that none of these prior art references addresses the problem of reproducibility especially during low dose ion implant monitoring.

SUMMARY OF THE INVENTION

It has been an object of at least one embodiment of the present invention to provide a method for measuring near surface densities (NSD) of impurities, such as implanted ions, in semiconductors.

Another object of at least one embodiment of the present invention has been to improve the reproducibility of said method relative to the current art.

Still another object of at least one embodiment of the present invention has been to improve the sensitivity of said method relative to the current art.

A further object of at least one embodiment of the present invention has been to provide a method for measuring contamination due to an oxidation furnace.

These objects have been achieved by forming a thermal oxide layer on the semiconductor surface thereby minimizing the charge leakage in the semiconductor space charge region; adjusting the implant profile such that the peak of the profile is positioned at the silicon-oxide interface, thereby reducing the sensitivity of a doping measurement to the depletion width. Thus, when a surface photovoltage (SPV) measurement is made it is insensitive to the width of the depletion layer. For a given oxide thickness, this holds true for a single ion implant energy. Additionally, variations in the initial wafer surface condition have been minimized by controlling of the charging dose and sequence prior to measuring the NSD using the SPV technique.

BRIEF DESCRIPTION OF THE DRAWINGS

FIG. 1 shows how different values for the surface barrier voltage are obtained from successive readings.

FIG. 2(a) shows how the implanted ion concentration can be very sensitive to the width of the depletion layer.

FIG. 2(b) shows how this sensitivity can be greatly reduced.

DESCRIPTION OF THE PREFERRED EMBODIMENTS

Figure 3:
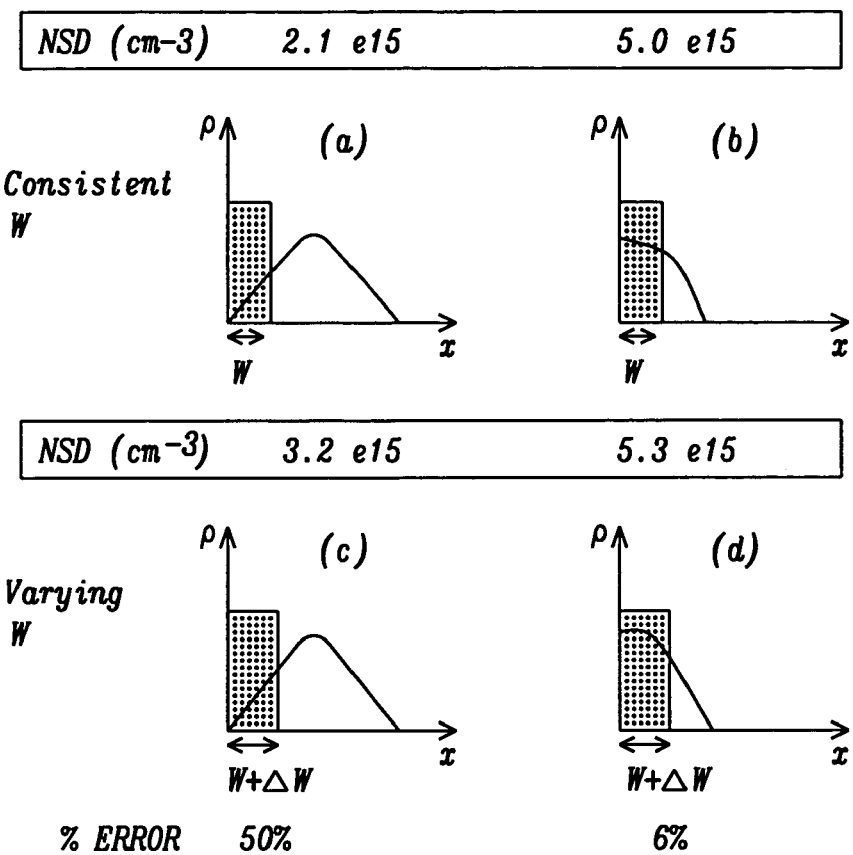
FIG. 3 compares errors in NSD values for the two cases shown in FIG. 2

The present invention adapts electrical-based metrology of Near Surface Doping (NSD) using Surface Photovoltage (SPV) to meet the requirements of the semiconductor industry in terms of sensitivity and reproducibility of implant dose and energy measurements.

The method in the present invention consists of the following principal steps:

1: Forming a dielectric layer (preferably a layer of thermally grown oxide) on the semiconductor surface followed by the determination of the NSD using SPV. The latter makes use of the non-equilibrium depletion transient condition created by charging the semiconductor surface with charge density, Q (C·cm$^{-2}$).

The relationship between Q and said depletion layer is shown in Equation 1:

$$Q = -Q_s = qN_AW \qquad \text{Eqn. (1)}$$

Where W is the depletion width, $Q_s$, is the induced charge density and NA is the acceptor density.

When a known amount of charge, of density Q, is injected into a semiconductor surface, a portion of the induced charge may be imaged into the semiconductor space charge region, while the rest will be imaged into the interface traps between the layer of native oxide and the semiconductor surface. As native oxide is known to be very leaky, the decay of resulting surface barrier ($V_{SB}$) is expected to behave as shown in FIG. 1.

In order to confine the induced charge density, $Q_s$, within the semiconductor depletion layer, a layer of a good quality dielectric (preferably thermal oxide) is formed on the semiconductor surface prior to implantation. Alternatively, this dielectric layer can be grown after implantation as part of the activation process. Normally, rapid thermal annealing (RTA) is used as the activation process after implantation. However, in order to grow this dielectric layer after implantation, RTA can be replaced by rapid thermal oxidation. Having the surface of the semiconductor capped with thermal oxide helps to minimize the density of surface traps and charge leakage.

2: Tailoring the implant profile so that implanted peak concentration is at or close to the dielectric-semiconductor interface.

The effective depth of NSD measurements relates to the semiconductor depletion layer. Eqn. (2) shows the relationship between the depletion width, W, the surface barrier, $V_{SB}$, and the doping, $N_A$:

$$W = [(2\epsilon_0 \epsilon / q \cdot N_A) \cdot (V_{SB} - kT/q)]^{1/2} \qquad \text{Eqn. (2)}$$

Where $\epsilon_0$ is the permitivity of free space, $\epsilon$ is the Si dielectric constant, Q is the elementary charge, and kT is the thermal energy.

Depletion width, W, is dependent on the junction voltage, thus a change in bias will bring about readjustment of W to a new appropriate value. The various examples shown in FIG. 2 are plots of resistivity as a function of distance from the oxide-semiconductor interface. As shown there, when the bias changes between Q+ΔQ and Q−ΔQ, the depletion width varies by W±ΔW. The doping concentration in the depletion region, which corresponds to the area under the curve there, will also therefore vary.

Under conditions of non-uniform doping, measurements done where the implant profile slopes significantly are highly susceptible to the introduction of variations in W (FIG. 2a examples) as compared with measurements done at the peak of the implant profile (see FIG. 2b examples).

If the depletion width remains unchanged for every measurement, as shown in FIGS. 3a and 3b, changes in dose can still be accurately resolved. However, a surface concentration that changes as the depletion width changes (going from 3a to 3c) will result in large errors because of the varying nature of the implant profile slope. However, if the concentration within the original and expanded depletion regions is relatively flat (going from 3b to 3d) the possibility for error is greatly reduced. Thus, it is necessary to adjust the implant profile so that its peak comes closer to the semiconductor-dielectric interface.

There is more than one way to tailor the implant profile. By varying the thermal oxide thickness and freezing the implant energy or by varying the implant energy based on a fixed thermal oxide thickness. To confirm the effectiveness of the invention, the second way was selected.

Figure 4:
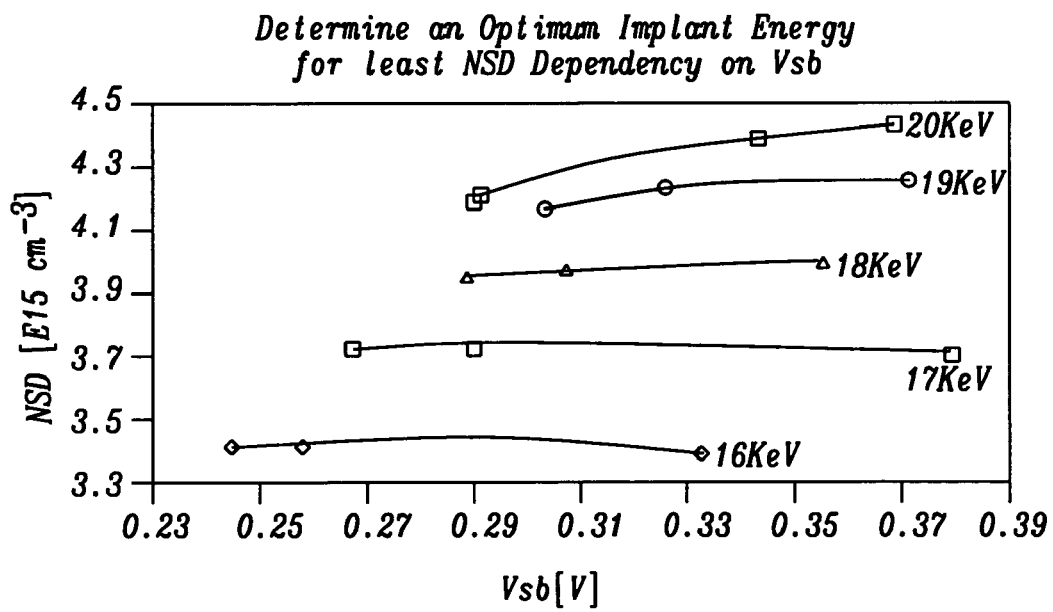
FIG. 4 plots NSD as a function of the surface barrier voltage for ions implanted with different energies, showing that the curve is flat for only one of these implant energies.

A layer of thermal oxide having a thickness of 10 nm was formed on the semiconductor wafers. These oxidized wafers are implanted with boron at different implant energies ranging from 16 keV to 20 keV so as to determine the optimum implant energy. The NSD of the wafers were then measured for different surface barrier voltages ($V_{SB}$) using SPV techniques on our equipment (SDI FAaST230). As seen in FIG. 4, doping at an implant energy of 18 keV provided the flattest curve, implying that, at this implant energy, the concentration is least dependent on $V_{SB}$.

3: Determining the surface barrier, $V_{SB}$, measurement range such that surface concentration is independent of $V_{SB}$ for a given implant dose:

From the experimental result obtained in step 2, it is possible to determine a range of surface barrier voltage over which the NSD remains relatively constant for small changes in the surface barrier voltage. In this invention, NSD remains almost constant for $V_{SB}$ ranging from 0.29 V to 0.36 V at 18 keV. This constant $V_{SB}$ range is different for different implant energies, as shown in FIG. 4.

4: Selecting $V_{SB}$ for starting measurement and determine the total amount of charge density needed to bias surface into the space-charge region.

As the initial surface condition of a $Si/SiO_2$ is arbitrary, $V_{SB}$ on the oxidized semiconductor surface has to be adjusted so as to ensure that it is biased into depletion at the start of the optimum range. This adjustment is done by introduction of charges to bias the semiconductor surface.

Figure 5:
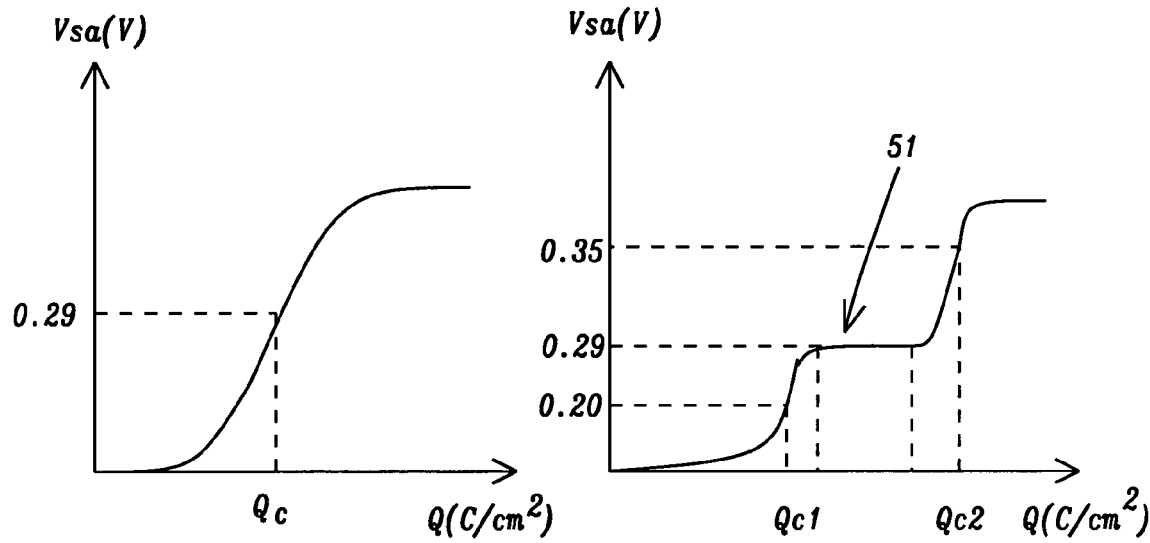
FIG. 5 shows how the presence of an ion trap can give misleading premature indications that the full surface barrier voltage has been reached.

In order to determine the total amount of charge density needed to bias the surface into space-charge measurement, repetitive charging and contact potential difference measurements were performed. FIG. 5 shows the results of the measurements with interface traps both present and absent.

When there is no interface trap, as shown in FIG. 5(a), total amount of charge needed to bias the semiconductor surface is $Q_C$ at $V_{SB}$=0.29. However, in the presence of interface trap 51, as shown in FIG. 5(b), a plateau occurs at $V_{SB}$=0.29. Selecting the correct $V_{SB}$ is important if interface traps are to be avoided. In the case of FIG. 5(b), when $V_{SB}$=0.20 the total amount of charge required is $Q_{c1}$ but when $V_{SB}$=0.35 the total amount of charge required is $Q_{c2}$ which can then be selected.

5: Compensating for variations in the initial wafer surface condition by controlling the charging dose and sequence.

After the total amount of charge density needed to bias surface into space-charge measurement for a predefined $V_{SB}$ has been determined, the next step is to define the charge density for each successive pulse of charging. This is done by dividing the total charge density by half the allowed charging sequence provided by the equipment.

Figure 6:
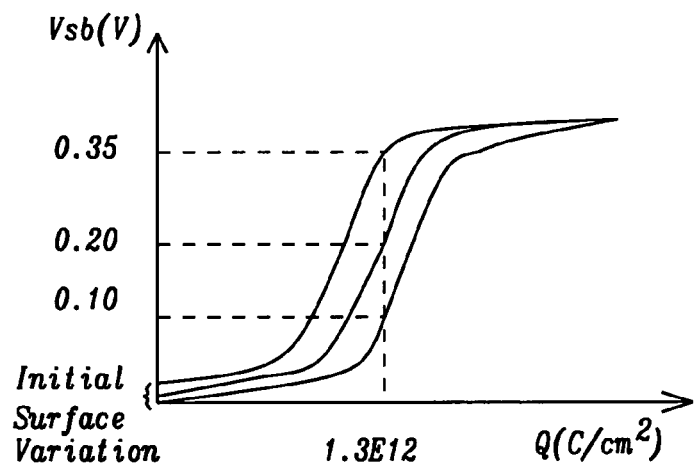
FIG. 6 shows how differences in the initial state of the semiconductor surface can lead to wrong results if too large a charge is injected.

As illustrated in FIG. 6, a single pulse of large charge (e.g. 1.3E12 $C/cm^2$) can bring about large variations in the surface barrier for the starting measurement due to the initial surface variations. So, instead of applying a single charging pulse to bias the surface barrier into depletion, the charging dose is reduced to (e.g. 2.2E11$C/cm^2$). Each small pulse is then successively applied until the predefined $V_{SB}$ (e.g. 0.20V) is reached. Using this technique, the number of pulse required to bias $V_{SB}$ to 0.20V can be varied to ensure that every measurement starts at almost the same surface barrier setting for all wafers, despite wide initial surface variations.

6: Obtaining SPV signals to determine the near surface doping concentration.

The SPV measurement to determine the NSD value is performed. For the present invention this measurement was performed using metrology tool, SDI FAaST230. As the noise of a SPV signal can also contribute to the reproducibility problem for such a measurement, the filter of the doping diode in the measuring tool was replaced to enhance the signal-to-noise performance. Such filter replacement may not be necessary for other SPV measurement tools.

Confirmatory Results

Figure 7:
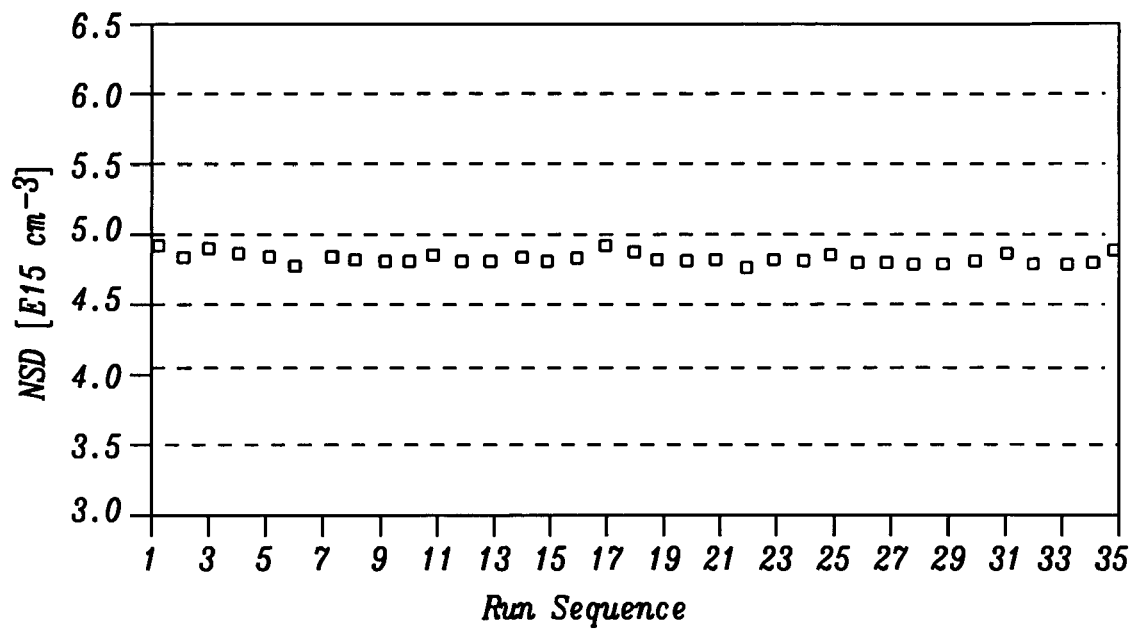
FIG. 7 show that consistent values of NSD will be obtained if the teachings of the present invention are used to measure them.
Figure 8:
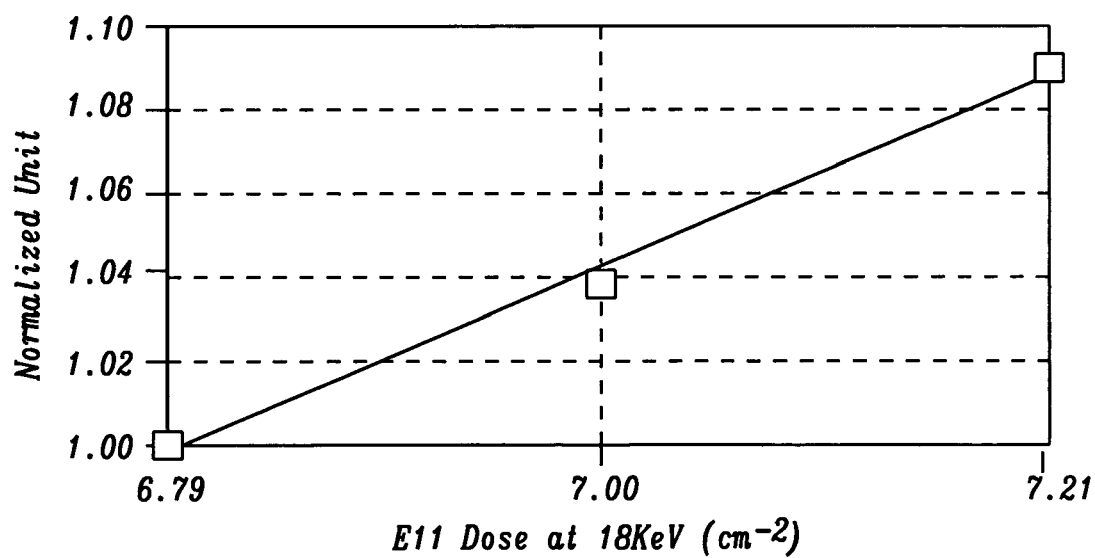
FIG. 8 is a normalized plot of NSD as a function of implant dosage in the range of from 6.79 to 7.21×10$^{11}$ atoms per sq.cm., illustrating the high sensitivity of the method of the present invention.

Implementing the methodology of the present invention, as detailed in the above steps, has resulted in a tremendous improvement for electrical-based measurement of ion implant dose in terms of reproducibility and sensitivity, as shown below in FIGS. 7 and 8 respectively.

Advantages of the Invention

Highly reproducible measurements of dopant concentration, especially for low dose implants.

Highly sensitive measurements of dopant concentration, especially for low dose implant;

Low cost and ease of implementation.

Can serve as a powerful resource for process improvement, monitoring, and control of the implant process.

Can give early warning of potential problems if incorporated in SPC control.

Helps to reduce downtime and facilitates troubleshooting.

Enables tighter sub-threshold Voltage (SVt) control to enhance yield.

Applicable for cross-contamination check in any oxidation furnace.

The invention claimed is:

1. A method to improve reproducibility of surface photovoltage measurements of a semiconductor, comprising
    forming a dielectric layer on said semiconductor surface, thereby creating a dielectric-semiconductor interface;
    implanting ions, having an energy range, such that said implanted ions have their maximum concentration level at said dielectric-semiconductor interface; and
    then performing said surface photovoltage measurements.

2. The method described in claim 1 wherein said dielectric layer is selected from the group consisting of silicon oxide, silicon nitride, and aluminum oxide.

3. The method described in claim 1 wherein said semiconductor is silicon and said dielectric layer is silicon oxide formed by thermal oxidation.

4. The method described in claim 1 wherein said dielectric layer is at least 20 Angstroms thick.

5. The method described in claim 1 wherein said implanted ions are selected from the group consisting of Boron, Phosphorous, and Arsenic.

6. The method described in claim 1 wherein said ion range is greater than 1 keV.

7. The method described in claim 1 wherein said ions are implanted at a dosage level of less than about 7×1011 ions per sq. cm.

8. A method to improve reproducibility of surface photovoltage measurements of a semiconductor, comprising
    implanting ions, having a narrow energy range, into said semiconductor;
    then forming a dielectric layer on said semiconductor surface, thereby creating a dielectric-semiconductor interface, said dielectric layer having a thickness selected so that said implanted ions have their maximum concentration level at said dielectric-semiconductor interface; and
    then performing said surface photovoltage measurements.

9. The method described in claim 8 wherein said dielectric layer is selected from the group consisting of silicon oxide, silicon nitride, and aluminum oxide.

10. The method described in claim 8 wherein said semiconductor is silicon and said dielectric layer is silicon oxide formed by thermal oxidation.

11. The method described in claim 8 wherein said selected thickness of said dielectric layer is at least 20 Angstroms.

12. The method described in claim 8 wherein said implanted ions are selected from the group consisting of Boron, Phosphorous, and Arsenic.

13. The method described in claim 8 wherein said ion energy is greater than 1 keV.

14. The method described in claim 8 wherein said ions are implanted at a dosage level of less than about 7×1011 ions per sq. cm.

15. A method to bias a semiconductor surface prior to performing surface photo-voltage measurements, comprising
    determining an amount of charge that is needed to bias said semiconductor surface into full depletion; and
    then injecting into the semiconductor a succession of at least two light pulses whose total photon energy is sufficient to create said amount of charge in the semiconductor.

16. The method described in claim 15 wherein said amount of charge that is needed to bias said semiconductor surface into full depletion is between 1011 and 1014 coulombs/cm2.

17. The method described in claim 15 wherein said light pulses are separated in time from one another by no more than about 200 microseconds.

18. The method described in claim 15 wherein said light pulses each has a pulse width between 100 microseconds and 0.5 milliseconds.

19. A method for measuring an implanted ion dose in a semiconductor having a surface, comprising
    forming a dielectric layer on said semiconductor surface, thereby creating a dielectric-semiconductor interface;
    implanting ions, having an energy range, into said semiconductor such that said implanted ions have their maximum concentration level at said dielectric-semiconductor interface;
    determining an amount of charge that is needed to bias said semiconductor surface into full depletion;
    then injecting into the semiconductor a succession of at least two light pulses whose total photon energy is sufficient to create said amount of charge, thereby biasing said surface;
    applying a light pulse of known energy content to said surface and then measuring a resulting photovoltage using a non-contacting electrode; and
    from said measured photovoltage computing said implanted ion dose.

20. The method described in claim 19 wherein said dielectric layer is selected from the group consisting of silicon oxide, silicon nitride, and aluminum oxide.

21. The method described in claim 19 wherein said semiconductor is silicon and said dielectric layer is silicon oxide formed by thermal oxidation.

22. The method described in claim 19 wherein said dielectric layer is at least 20 Angstroms thick.

23. The method described in claim 19 wherein said implanted ions are selected from the group consisting of Boron, Phosphorous, and Arsenic.

24. The method described in claim 19 wherein said ion energy is greater than 1 keV.

25. The method described in claim 19 wherein said ions are implanted at a dosage level of less than about 7×1011 ions per sq. cm.

26. The method described in claim 19 wherein said amount of charge that is needed to bias said semiconductor surface into full depletion is between 1011 and 1014 coulombs/cm2.

27. The method described in claim 19 wherein said light pulses are separated in time from one another by no more than about 200 microseconds.

28. The method described in claim 19 wherein said light pulses each has a pulse width between 100 microseconds and 0.5 milliseconds.

29. A method for measuring an implanted ion dose in a semiconductor having a surface, comprising
    implanting ions, having a narrow energy range, into said semiconductor;
    then forming a dielectric layer on said semiconductor surface, thereby creating a dielectric-semiconductor interface, said dielectric layer having a thickness selected so that said implanted ions have their maximum concentration level at said dielectric-semiconductor interface;
    determining an amount of charge that is needed to bias said semiconductor surface into full depletion;
    then injecting into the semiconductor a succession of at least two light pulses whose total photon energy is sufficient to create said amount of charge, thereby biasing said surface;
    applying a light pulse of known energy content to said surface and then measuring a resulting photovoltage using a non-contacting electrode; and
    from said measured photovoltage computing said implanted ion dose.

30. The method described in claim 29 wherein said dielectric layer is selected from the group consisting of silicon oxide, silicon nitride, and aluminum oxide.

31. The method described in claim 29 wherein said semiconductor is silicon and said dielectric layer is silicon oxide formed by thermal oxidation.

32. The method described in claim 29 wherein said selected thickness of said dielectric layer is greater than 20 Angstroms.

33. The method described in claim 29 wherein said implanted ions are selected from the group consisting of Boron, Phosphorous, and Arsenic.

34. The method described in claim 29 wherein said ion energy is greater than 1 keV.

35. The method described in claim 29 wherein said ions are implanted at a dosage level of less than about 7×1011 ions per sq. cm.

36. The method described in claim 29 wherein said amount of charge that is needed to bias said semiconductor surface into full depletion is between 1011 and 1014 coulombs/cm2.

37. The method described in claim 29 wherein said light pulses are separated in time from one another by no more than about 200 microseconds.

38. The method described in claim 29 wherein said light pulses each has a pulse width between 100 microseconds and 0.5 milliseconds.

* * * * *

UNITED STATES PATENT AND TRADEMARK OFFICE
CERTIFICATE OF CORRECTION

| | |
|---|---|
| PATENT NO. | : 7,029,933 B2 |
| APPLICATION NO. | : 10/874474 |
| DATED | : April 18, 2006 |
| INVENTOR(S) | : Siew Fong Wee and Luey Chwan Liong |

It is certified that error appears in the above-identified patent and that said Letters Patent is hereby corrected as shown below:

In the Assignee in item (73), delete "Tech Semiconductor Singapore Pte. Ltd., Singapore (SG)" and replace with - - TECH Semiconductor Singapore Pte. Ltd., Singapore (SG) - --.

In the Inventors in item (75), delete "Luey Chwan Liong, Malaysia (S)" and replace with - - Luey Chwan Liong, Singapore, (SG) - -.

Signed and Sealed this

Twenty-second Day of August, 2006

JON W. DUDAS
*Director of the United States Patent and Trademark Office*